(12) United States Patent
Rangasayee

(10) Patent No.: US 6,198,303 B1
(45) Date of Patent: Mar. 6, 2001

(54) CONFIGURATION EPROM WITH PROGRAMMABLE LOGIC

(75) Inventor: Krishna Rangasayee, Mountain View, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 09/274,174

(22) Filed: Mar. 23, 1999

Related U.S. Application Data

(60) Provisional application No. 60/079,281, filed on Mar. 25, 1998.

(51) Int. Cl.[7] .................................................. H03K 19/173
(52) U.S. Cl. .................................. 326/38; 326/38; 326/39; 326/40; 326/41
(58) Field of Search ................................. 326/38, 39, 40, 326/41

(56) References Cited

U.S. PATENT DOCUMENTS

| | | | |
|---|---|---|---|
| 5,640,107 | * 6/1997 | Kruse | 326/38 |
| 5,646,544 | * 7/1997 | Iadanza | 326/38 |
| 5,760,607 | * 6/1998 | Leeds et al. | 326/38 |
| 5,768,372 | * 6/1998 | Sung et al. | 380/3 |
| 5,859,544 | * 1/1999 | Norman | 326/40 |
| 5,870,410 | * 2/1999 | Norman et al. | 371/22.2 |
| 5,923,614 | * 7/1999 | Erickson et al. | 365/236 |
| 5,999,015 | * 12/1999 | Cliff et al. | 326/39 |
| 6,028,445 | * 2/2000 | Lawman | 326/38 |
| 6,031,391 | * 2/2000 | Couts-Martin et al. | 326/38 |

* cited by examiner

*Primary Examiner*—Michael Tohar
*Assistant Examiner*—Vibol Tan
(74) *Attorney, Agent, or Firm*—Pennie & Edmonds LLP

(57) ABSTRACT

An electronic device includes an Erasable Programmable Read-Only Memory (EPROM), a programmable logic device connected to the EPROM, and a single package enclosing the EPROM and the programmable logic device. The electronic device provides combined functionality that allows the EPROM to store configuration data for a programmable logic device, a Static Random Access Memory (SRAM), or an external programmable logic device, while the programmable logic device is configured to implement another function, such as a Joint Test Access Group interface function, an address decoder function, or a state machine function.

17 Claims, 4 Drawing Sheets

CONFIGURATION EPROM WITH PROGRAMMABLE LOGIC

This application claims priority to the provisional patent application entitled: "Configuration EPROM with Programmable Logic", Ser. No. 60/079,281, filed Mar. 25, 1998.

BRIEF DESCRIPTION OF THE INVENTION

This invention relates generally to Erasable Programmable Read-Only Memories (EPROMs) used to configure electronic devices, such as programmable logic devices or Static Random Access Memories (SRAMs). More particularly, this invention relates to a single package electronic device including both a programmable logic device and an EPROM.

BACKGROUND OF THE INVENTION

Erasable Programmable Read-Only Memories (EPROMs) are used to configure electronic devices, such as Static Random Access Memories (SRAMs) and programmable logic devices. In the case of SRAMs, the SRAM must be configured each time the system initializes. Generally, this initialization configuration is achieved by downloading data from an EPROM into the SRAM. Additionally, data may be transferred from the EPROM to the SRAM whenever new configuration data is needed. EPROMs are used in a similar manner when configuring programmable logic devices.

EPROMs are commonly used on a printed circuit board with other control circuits. Frequently, these control circuits operate in connection with programmable logic devices to which the EPROMs download configuration data. Since EPROMs and control circuits sometimes operate together it would be highly desirable to provide an EPROM that could perform both fundamental configuration functions and extended control functions. Such an approach could reduce the number of circuits on a printed circuit board, thereby saving space and otherwise reduce cost.

SUMMARY OF THE INVENTION

An electronic device includes an Erasable Programmable Read-Only Memory (EPROM), a programmable logic device connected to the EPROM, and a single package enclosing the EPROM and the programmable logic device. The electronic device provides combined functionality that allows the EPROM to store configuration data for an external programmable logic device, while the programmable logic device is configured to implement some other function, such as a Joint Test Access Group interface function, an address decoder function, or a state machine.

The device of the invention eliminates the need for discrete devices on a printed circuit board and therefore saves space on the printed circuit board. Further, the combined functional device of the invention is less expensive than the discrete device approach of the prior art. The invention also allows a user to make last minute changes to the configuration schemes without altering the layout of the printed circuit board.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
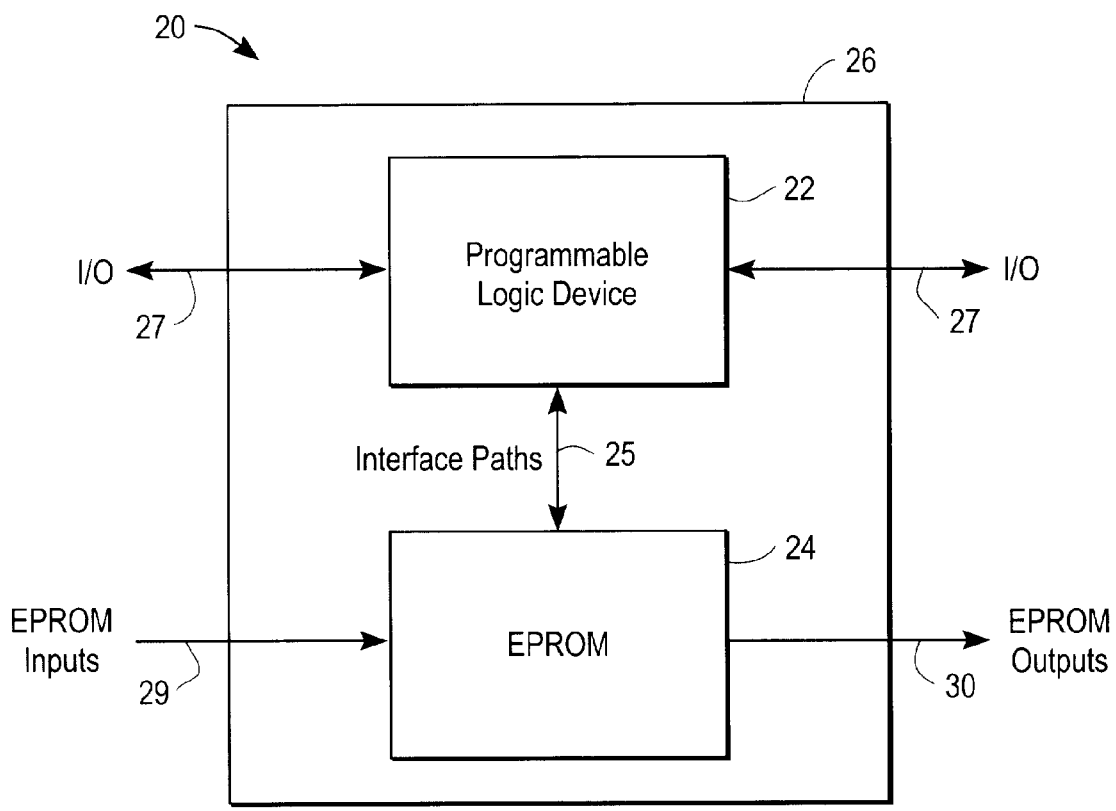
FIG. 1 illustrates an electronic device constructed in accordance with an embodiment of the invention.

FIG. 1 illustrates an electronic device 20 constructed in accordance with an embodiment of the invention. Electronic device 20 includes a programmable logic device 22 and an EPROM 24 housed in a single package 26. By way of example, programmable logic device 22 may be from the MAX 7000 Programmable Logic Device Family sold by Altera Corporation, San Jose, Calif., while the EPROM may be from the Configuration EPROMs for FLEX Devices sold by Altera Corporation, San Jose, Calif. Programmable logic device 22 and EPROM 24 may be on separate substrates or a single substrate. Interface paths 25 are formed between the programmable logic device 22 and the EPROM 24.

As shown in FIG. 1, package 26 includes input/output pins 27. Also, the package 26 has EPROM input pins 29 and EPROM output pins 30.

In one embodiment of the invention, EPROM 24 is preprogrammed with data. Upon initialization of electronic device 20, EPROM 24 uses interface paths 25 to send certain of the stored data to programmable logic device 22. The data transferred from EPROM 24 may be used to configure programmable logic device 22. Programmable logic device 22 could be a standard programmable logic device.

Figure 2:
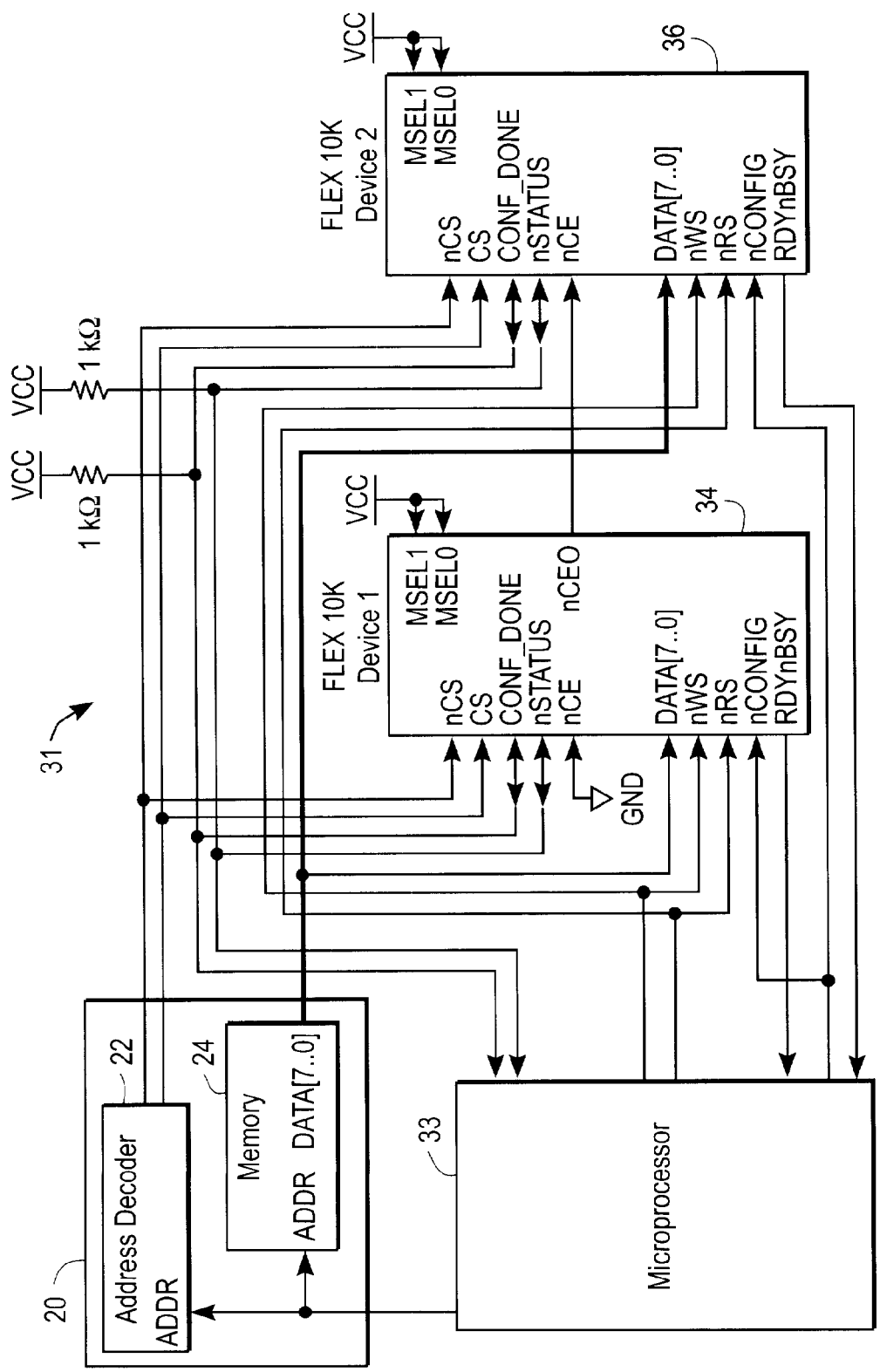
FIG. 2 illustrates the electronic device of the invention being used in connection with a microprocessor and external programmable logic devices.

FIG. 2 illustrates electronic device 20 as a component of a system 31. In FIG. 2, electronic device 20 is electrically connected to a microprocessor 33 and a set of external programmable logic devices 34 and 36. External programmable logic devices 34 and 36 may be any programmable logic device, SRAM, Dynamic Random Access Memory, or the like. In one embodiment of the system of FIG. 2, programmable logic device 22 is configured as a decoder 22 and EPROM 24 stores configuration data for external programmable logic devices 34 and 36. Decoder 22 allows microprocessor 33 to select a particular external programmable logic device by directing decoder 22 to send a signal accessing a particular address or providing a particular signal to an already selected address.

In one example of the operation of the system of FIG. 2, EPROM 24 is programmed with data. Upon initialization of the system, EPROM 24 may transfer certain of the data to decoder 22 thereby providing decoder 22 with configuration information. Additionally, EPROM 24 provides certain of its data to external programmable devices 34 and 36. External programmable devices 34 and 36 may be selectively enabled according to the signals of decoder 22. Microprocessor 33 may direct decoder 22 to send electronic signals, selectively enabling external programmable device 34 or 36.

In yet another embodiment of the invention, programmable logic device 22 is a state machine. The interactions between the state machine 22, EPROM 24, microprocessor 33, and external programmable logic devices 34 and 36 are analogous to the interactions described with respect to the previous embodiments of the invention.

In the prior art, a separate decoder or state machine and EPROM have been used to perform functions that are executed by the unitary device of the invention. Electronic device 20 simplifies the configuration process, reduces the number of devices on the printed circuit board, and also reduces system cost.

Figure 3:
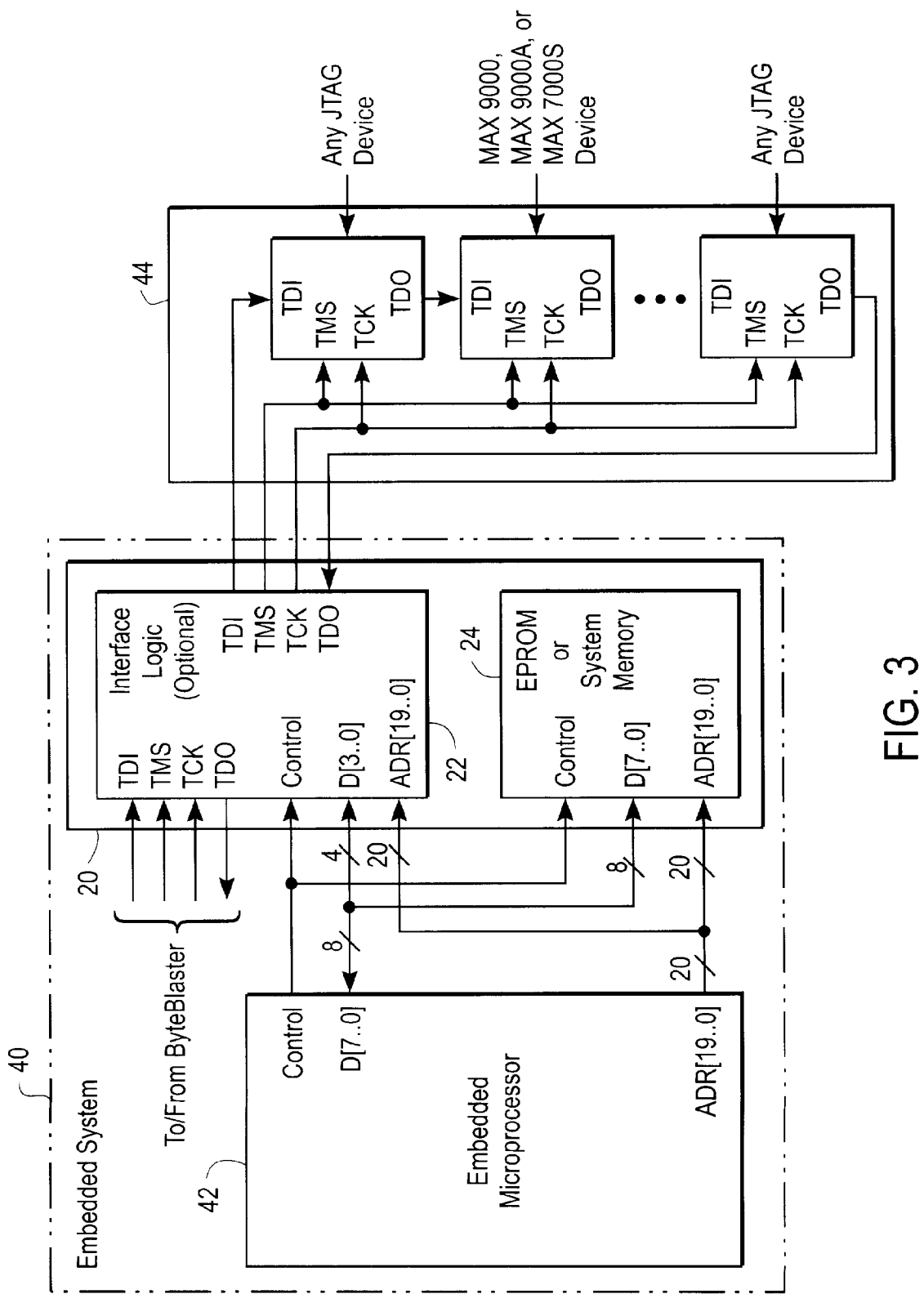
FIG. 3 illustrates the electronic device of the invention being used in an embedded system.

FIG. 3 illustrates device 20 of the invention positioned in an embedded system 40, which includes an embedded microprocessor 42. In one embodiment of the apparatus of FIG. 3, programmable logic device 22 is implemented as a JTAG interface circuit. JTAG external circuitry 44 interacts with programmable logic device 22. JTAG external circuitry 44 is used to program and interact with the embedded system 40, as appreciated by those skilled in the art.

Figure 4:
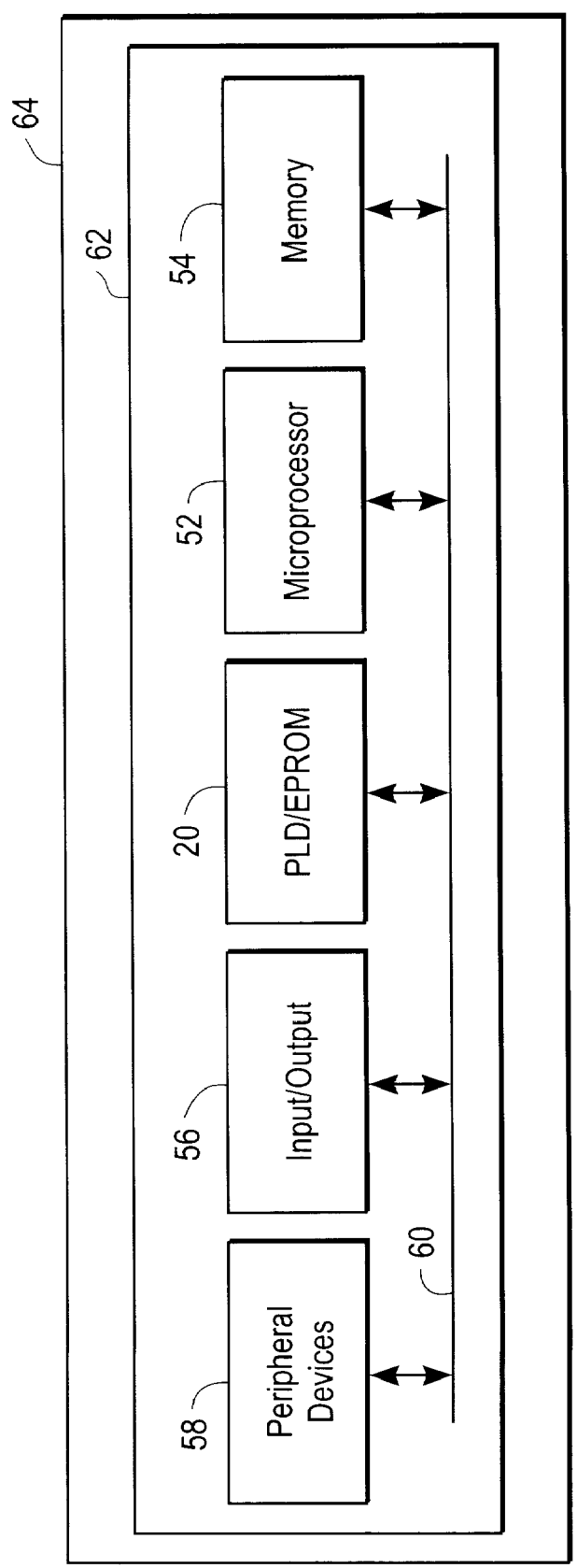
FIG. 4 illustrates the electronic device of the invention incorporated into a data processing system.

FIG. 4 illustrates electronic device 20 of the present invention connected to a system bus 60 in a data processing system 50. Data processing system 50 may include one or more of the following components: a microprocessor 52, memory 54, for example SRAM, input/output circuitry 56, and peripheral devices 58. These components are coupled together by a system bus 60 and are populated on a circuit board 62, which is contained in an end-user system 64.

Electronic device 20 can be implemented by itself or in a system, such as system 50, to facilitate a wide variety of tasks, such as computer networking, data networking, instrumentation, video processing, digital signal processing, process monitoring, system failure detection, status indicator, data encryption, or any other application where the advantage of using reprogrammable logic and an EPROM is desirable. As demonstrated above, device 20 can be used to perform a variety of logic functions. Additional implementation examples include using device 20 as a processor or controller that works in cooperation with microprocessor 52. Device 20 may also be used as an arbiter for arbitrating access to a shared resource in system 50. In yet another example, device 20 can be configured as an interface between microprocessor 52 and one of the other components in system 50. It should be noted that the foregoing examples including the implementation of electronic device 20 in system 50 is only exemplary, and that the true scope and spirit of the invention should be indicated by the claims.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

What is claimed is:

1. An electronic device, comprising:
    a programmable logic device;
    an Erasable Programmable Read-Only Memory (EPROM) connected to said programmable logic device, said EPROM storing configuration data for an external programmable logic device; and
    a single package enclosing said EPROM and said programmable logic device.

2. The electronic device of claim 1 wherein said programmable logic device is configured as a Joint Test Access Group (JTAG) interface circuit.

3. The electronic device of claim 1 wherein said programmable logic device is configured as an address decoder.

4. The electronic device of claim 1 wherein said programmable logic device is configured as a state machine.

5. The electronic device of claim 1 in combination with a system bus.

6. The electronic device of claim 5 further comprising a system component connected to said system bus, said system component selected from the group consisting of: a peripheral device, an input/output device, a microprocessor, and an external memory device.

7. A method of using a single package electronic device containing at least one Erasable Programmable Read-Only Memory (EPROM) and one programmable logic device, said method comprising the steps of:
    storing data in said EPROM;
    programming said programmable logic device by transferring certain of the data from said EPROM to said programmable logic device;
    providing data from said EPROM to at least one external programmable logic device; and
    configuring said at least one external programmable logic device according to said data from said EPROM.

8. The method of claim 7, further comprising the step of:
    directing said programmable logic device to route a signal that enables said at least one external programmable logic device.

9. The method of claim 7 wherein said programming step includes the step of programming said programmable logic device as a decoder.

10. The method of claim 7 wherein said programming step includes the step of programming said programmable logic device as a JTAG interface circuit.

11. The method of claim 7 wherein said programming step includes the step of programming said programmable logic device as a state machine.

12. A self-configuring electronic system, comprising:
    a single package electronic device, including:
        an EPROM storing configuration data; and
        a programmable logic device connected to said EPROM; and
    at least one external programmable logic device interfaced to said single package electronic device, said external programmable logic device being configured in response to said configuration data from said EPROM.

13. The self-configuring electronic system of claim 12, further comprising a microprocessor electrically connected to said single package electronic device such that said microprocessor directs said programmable logic device to send said electronic signals to said at least one external programmable logic device, said electronic signals enabling said at least one external programmable logic device.

14. The self-configuring electronic system of claim 12, further comprising:
    a system bus connected to said single package electronic device; and
    a system element connected to said system bus, said system element selected from the group consisting of: a peripheral device, an input/output device, a microprocessor, and an external memory device.

15. The self-configuring electronic system of claim 12 wherein said programmable logic device is configured as a decoder.

16. The self-configuring electronic system of claim 12 wherein said programmable logic device is configured as a JTAG interface circuit.

17. The self-configuring electronic system of claim 12 wherein said programmable logic device is configured as a state machine.

* * * * *